(12) United States Patent
Park

(10) Patent No.: US 11,106,581 B2
(45) Date of Patent: Aug. 31, 2021

(54) MEMORY CONTROLLER AND MEMORY SYSTEM HAVING THE MEMORY CONTROLLER

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 1 day.

(21) Appl. No.: 16/698,244

(22) Filed: Nov. 27, 2019

(65) Prior Publication Data
US 2020/0401518 A1 Dec. 24, 2020

(30) Foreign Application Priority Data

Jun. 24, 2019 (KR) .......................... 10-2019-0075239

(51) Int. Cl.
| | |
|---|---|
| G06F 12/06 | (2006.01) |
| G11C 11/56 | (2006.01) |
| G11C 16/08 | (2006.01) |
| G11C 16/10 | (2006.01) |
| G11C 16/04 | (2006.01) |

(52) U.S. Cl.
CPC ...... G06F 12/0653 (2013.01); G11C 11/5628 (2013.01); G11C 11/5671 (2013.01); G11C 16/0483 (2013.01); G11C 16/08 (2013.01); G11C 16/10 (2013.01); *G06F 2212/1016* (2013.01); *G11C 2216/14* (2013.01)

(58) Field of Classification Search
CPC ......... G06F 12/0653; G06F 2212/1016; G11C 11/5628; G11C 11/5671; G11C 16/08; G11C 16/10; G11C 16/0483; G11C 2216/14

USPC ....................................................... 711/203
See application file for complete search history.

(56) References Cited

U.S. PATENT DOCUMENTS

| | | | | |
|---|---|---|---|---|
| 2006/0126390 | A1* | 6/2006 | Gorobets | G11C 11/5628 |
| | | | | 365/185.22 |
| 2007/0061538 | A1* | 3/2007 | Chang | G06F 12/0882 |
| | | | | 711/169 |
| 2016/0380532 | A1* | 12/2016 | Reddy | G11C 11/5621 |
| | | | | 365/185.18 |
| 2017/0236591 | A1* | 8/2017 | Shimura | G11C 16/0483 |
| | | | | 365/185.12 |

(Continued)

FOREIGN PATENT DOCUMENTS

KR  10-0713984  5/2007

*Primary Examiner* — Fernando Hidalgo
(74) *Attorney, Agent, or Firm* — IP & T Group LLP

(57) ABSTRACT

There are provided a memory controller for performing a program operation and a memory system having the memory controller. The memory system includes a memory device including first and second planes each including a plurality of m-bit (m is a natural number of 2 or more) multi-level cell (MLC) blocks; and a memory controller for allocating a first address corresponding to a first MLC block of the m-bit MLC blocks in which first m-bit MLC data is to be programmed and a second address corresponding to a second MLC block of the m-bit MLC blocks in which second m-bit MLC data is to be programmed, and transmitting the allocated addresses and logical page data included in the m-bit MLC data to the memory device. The memory controller differently determines a transmission sequence of the logical page data according to whether the addresses correspond to the same plane among the planes.

17 Claims, 10 Drawing Sheets

(56) References Cited

U.S. PATENT DOCUMENTS

2020/0201570 A1* 6/2020 Kim .................... G06F 12/0238

* cited by examiner

MEMORY CONTROLLER AND MEMORY SYSTEM HAVING THE MEMORY CONTROLLER

CROSS-REFERENCE TO RELATED APPLICATION

The present application claims priority under 35 U.S.C. § 119(a) to Korean patent application number 10-2019-0075239, filed on Jun. 24, 2019, which is incorporated herein by reference in its entirety.

BACKGROUND

Field of Invention

The present disclosure generally relates to a memory controller, and more particularly, to a memory controller for performing a program operation and a memory system having the memory controller.

Description of Related Art

A memory system may include a memory controller and a memory device.

When a program request, a logical address, and data are received from a host, the memory controller may allocate a physical address of the memory device corresponding to the received logical address, and control the memory device such that the data can be stored at the allocated physical address.

SUMMARY

Various embodiments of the present invention provide a memory controller capable of controlling a sequence in which data are programmed in the memory device and a memory system having the memory controller.

In accordance with an aspect of the present disclosure, there is provided a memory system including a memory device including first and second planes each including a plurality of M-bit multi-level cell (MLC) blocks, where M is a natural number of 2 or more; and a memory controller configured to: allocate a first address corresponding to a first MLC block of the M-bit MLC blocks, in which first M-bit MLC data is to be programmed and a second address corresponding to a second MLC block of the M-bit MLC blocks, in which second M-bit MLC data is to be programmed, and transmit the allocated addresses and plural pieces of logical page data included in the first and second M-bit MLC data to the memory device, wherein the memory controller is further configured to differently determine a transmission sequence of the plural pieces of logical page data for the transmission according to whether the first and second addresses correspond to a same plane in the memory device.

In accordance with another aspect of the present disclosure, there is provided a memory controller including a first buffer configured to store program data received from a host; a data divider configured to divide the program data into first and second m-bit MLC data each including m (m is a natural number of 2 or more) logical page data; an address allocator configured to allocate a first address corresponding to a first MLC block to which the first m-bit MLC data is to be programmed among a plurality of m-bit MLC blocks included in a memory device and a second address corresponding to a second MLC block to which the second m-bit MLC data is to be programmed among the plurality of m-bit MLC blocks; a second buffer configured to output the logical page data to the memory device according to a sequence in which the logical page data are queued; and a data sequence manager configured to differently determine a transmission sequence of logical page data included in the first and second m-bit MLC data according to whether the first and second addresses correspond to a same plane included in the memory device, and queue the logical page data in the second buffer according to the determined transmission sequence.

In accordance with an aspect of the present disclosure, there is provided an operating method of a controller for controlling a memory device including a plane having N number of M-bit multi-level cell (MLC) blocks including arranging N groups of M pieces of logical page data by units of the N groups and in an ascending order of logical levels of the logical page data within each of the N groups, the M pieces respectively corresponding to the logical levels; and controlling the memory device to sequentially store the arranged logical page data by units of the N groups into the MLC blocks.

These and other features and advantages of the present invention will be better understood by those with ordinary skill in the art of the present invention from the following detailed description in conjunction with the accompanying drawings.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It is noted that the drawings are simplified schematics and may omit well-known features in order avoid obscuring the disclosure of the present invention.

Also, it is noted that features described in one embodiment may be combined with one or more features of another embodiment without departing from the scope of the present invention.

Figure 1:
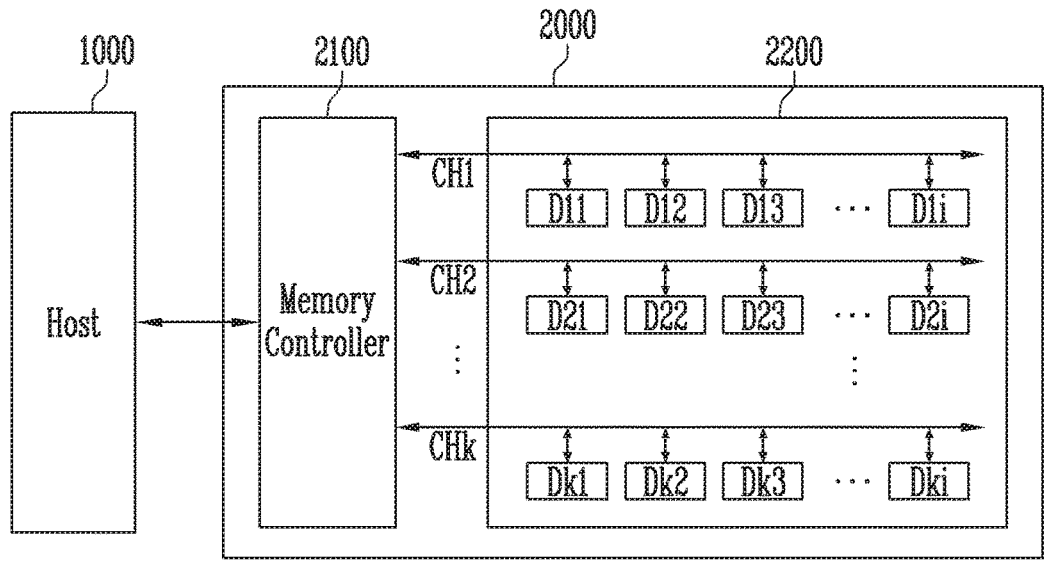
FIG. 1 is a diagram illustrating a memory system in accordance with an embodiment of the present disclosure.

FIG. 1 is a diagram illustrating a memory system 2000 in accordance with an embodiment of the present disclosure.

The memory system 2000 may include a memory device 2200 configured to store data and a memory controller 2100 configured to control the memory device 2200 in response to a request from a host 1000.

The host 1000 may be a device or system configured to store data in the memory system 2000 or retrieve data from the memory system 2000. The host 1000 may be any suitable electronic device, including, for example, at least one of a computer, a portable digital device, a tablet, a digital camera, a digital audio player, a television, a wireless communication device, or a cellular phone. The memory 2000 system may be permanently or retrievably embedded in the host 1000. The memory system 2000 may be external to the host 1000 and coupled via a wire or wirelessly with the host 1000.

The memory controller 2100 may control the overall operations of the memory system 2000. The memory controller 2100 may perform various operations in response to a request from the host 1000. For example, the memory controller 2100 may perform a program operation, a read operation, and an erase operation on the memory device 2200. In a program operation, the memory controller 2100 may transmit a program command, an address, and data to the memory device 2200. In a read operation, the memory controller 2100 may transmit a read command and an address to the memory device 2200, and receive read data from the memory device 2200. In an erase operation, the memory controller 2100 may transmit an erase command and an address to the memory device 2200.

The memory device 2200 may perform a program operation, a read operation, an erase operation, and other operations under the control of the memory controller 210. The memory device 2200 may include at least one die D11 to D1i, D21 to D2i, . . . , and Dk1 to Dki. Here, k and i are natural numbers. For example, the dies D11 to D1i, D21 to D2i, . . . , and Dk1 to Dki may be implemented with a volatile memory device in which stored data disappears when the supply of power is interrupted or a non-volatile memory device in which stored data is retained even when the supply of power is interrupted. For example, the dies D11 to D1i, D21 to D2i, . . . , and Dk1 to Dki may be implemented with a NAND flash memory device.

The dies D11 to D1i, D21 to D2i, . . . , and Dk1 to Dki may be coupled to the memory controller 2100 through a plurality of channels CH1 to CHk. For example, dies D11 to D1i may be coupled to the memory controller 2100 through a first channel CH1, dies D21 to D2i may be coupled to the memory controller 2100 through a second channel CH2, and dies Dk1 to Dki may be coupled to the memory controller 2100 through a kth channel CHk.

Each of the dies D11 to D1i, D21 to D2i, . . . , and Dk1 to Dki may receive a program command, an address, and data from the memory controller 2100, and store the data according to the program command and the address. Each of the dies D11 to D1i, D21 to D2i, . . . , and Dk1 to Dki may perform a read operation according to a read command and an address, which are received from the memory controller 2100, and provide read data to the memory controller 2100.

Each of the dies D11 to D1i, D21 to D2i, . . . , and Dk1 to Dki may perform an erase operation according to an erase command and an address, which are received from the memory controller 2100.

Figure 2:
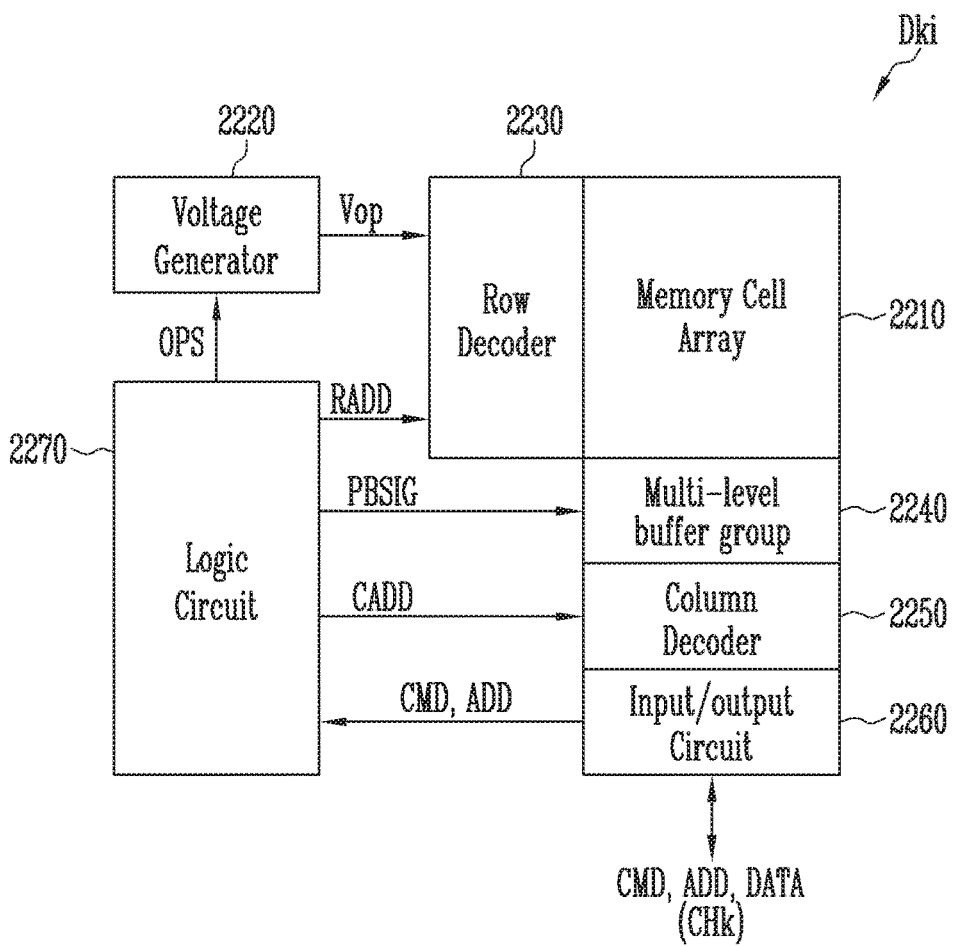
FIG. 2 is a diagram illustrating in detail an example of a die among a plurality of dies shown in FIG. 1.

FIG. 2 is a diagram illustrating in detail as an example a die Dki shown in FIG. 1. The die DKi is representative of all the dies of the memory device 2200 of FIG. 1. All the dies of FIG. 1 may be made identical to the DKi die.

Referring to FIG. 2, the die Dki may include a memory cell array 2210 configured to store data, peripheral circuits 2220 to 2260 configured to perform a program, read or erase operation, and a logic circuit 2270 configured to control the peripheral circuits 2220 to 2260.

The memory cell array 2210 may include a plurality of planes. Each of the planes may include a plurality of memory blocks in which data is stored. Each of the memory blocks may include a plurality of memory cells. The memory cells may be implemented in a two-dimensional structure in which the memory cells are arranged in parallel to a substrate or a three-dimensional structure in which the memory cells are stacked vertically to a substrate. The memory cell array 2210 will be described in more detail in an embodiment described with reference to FIG. 3.

The peripheral circuits 2220 to 2260 may include a voltage generator 2220, a row decoder 2230, a multi-level buffer group 2240, a column decoder 2250, and an input/output circuit 2260.

The voltage generator 2220 may generate and output operating voltages Vop necessary for various operations in response to an operation signal OPS. For example, the voltage generator 2220 may generate at least one operating voltage Vop among a program voltage, a verify voltage, a read voltage, a pass voltage, and an erase voltage. The voltage generator 2220 may output the generated operating voltage Vop to the row decoder 2230.

The row decoder 130 may transmit the operating voltage Vop to a memory block included in the memory cell array 2210 selected according to a row address RADD, through local lines coupled to the selected memory block.

The multi-level buffer group 2240 may include a plurality of multi-level buffers coupled to bit lines. The multi-level buffer group 2240 may include multi-level buffers corresponding to each of the planes included in the die Dki. The multi-level buffers may temporarily store data for program, read, and verify operations in response to a multi-level buffer control signal PBSIG. Each of the multi-level buffers may include a plurality of latches for temporarily storing data for program, read, and verify operations. The multi-level buffer group 2240 will be described in more detail with reference to FIG. 3.

The column decoder 2250 may transfer data received from the input/output circuit 2260 in a program operation to the multi-level buffer group 2240 or transfer data received from the multi-level buffer group 2240 in a read operation to the input/output circuit 2260, in response to a column address CADD.

The input/output circuit 2260 may be coupled to the memory controller 2100 shown in FIG. 1 through input/output lines included in the channel CHk to input/output a command CMD, an address ADD, and data DATA. For example, in a program operation, the input/output circuit 2260 may transmit the command CMD and the address ADD, which are received from the memory controller 2100, to the logic circuit 2270, and transmit the data DATA received from the memory controller 2100 to the column decoder 2250. The address ADD input to the input/output circuit 2260 may be a physical address that the memory controller 2100 outputs. For example, in a read operation, the input/output circuit 2260 may output data DATA received from the column decoder 2250 to the memory controller 2100 through the input/output lines.

The control logic 2270 may control the peripheral circuits 2220 to 2260, in response to the command CMD and the address ADD which are received through the input/output circuit 2260. The control logic 2270 may generate the operation signal OPS and the multi-level control signal PBSIG in response to the command CMD, and generate the row address RADD and the column address CADD in response to the address ADD.

In a program operation, the control logic 2270 may store plural pieces of logical page data included in data DATA in multi-level buffers included in the multi-level buffer group 2240 according to the address ADD received from the input/output circuit 2260.

In a program operation, when addresses ADD received through the input/output circuit 2260 correspond to different planes, the control logic 2270 may store logical page data included in data DATA in multi-level buffers corresponding to the different planes. For example, the control logic 2270 may store M pieces of logical page data received in an odd-numbered order among the logical page data in any one multi-level buffer included in the multi-level buffer group 2240, and store M pieces of logical page data received in an even-numbered order among the logical page data in another multi-level buffer included in the multi-level buffer group 2240.

In a program operation, when addresses ADD received through the input/output circuit 2260 correspond to the same plane, the control logic 2270 may store logical page data included in data DATA in a multi-level buffer corresponding to the same plane.

The control logic 2270 may perform a first program operation of programming plural pieces of logical page data stored in one multi-level buffer to one physical page.

For example, when addresses ADD received through the input/output circuit 2260 correspond to different planes, the control logic 2270 may program M pieces of logical page data stored in any one multi-level buffer to one physical page included in a memory block corresponding to a first address of the addresses ADD, and program M pieces of logical page data stored in another multi-level buffer to one physical page included in a memory block corresponding to a second address of the addresses ADD.

For example, when addresses ADD received through the input/output circuit 2260 correspond to the same plane, the control logic 2270 may program previous M pieces of logical page data among plural pieces of logical page data sequentially stored in a multi-level buffer corresponding to the same plane to one physical page included in a memory block corresponding to a first address of the addresses ADD. Subsequently, the control logic 2270 may program subsequent M pieces of logical page data among the plural pieces of logical page data sequentially stored in the multi-level buffer corresponding to the same plane to one physical page included in a memory block corresponding to a second address of the addresses ADD.

The first program operation will be described in more detail with reference to FIGS. 3-9.

Figure 3:
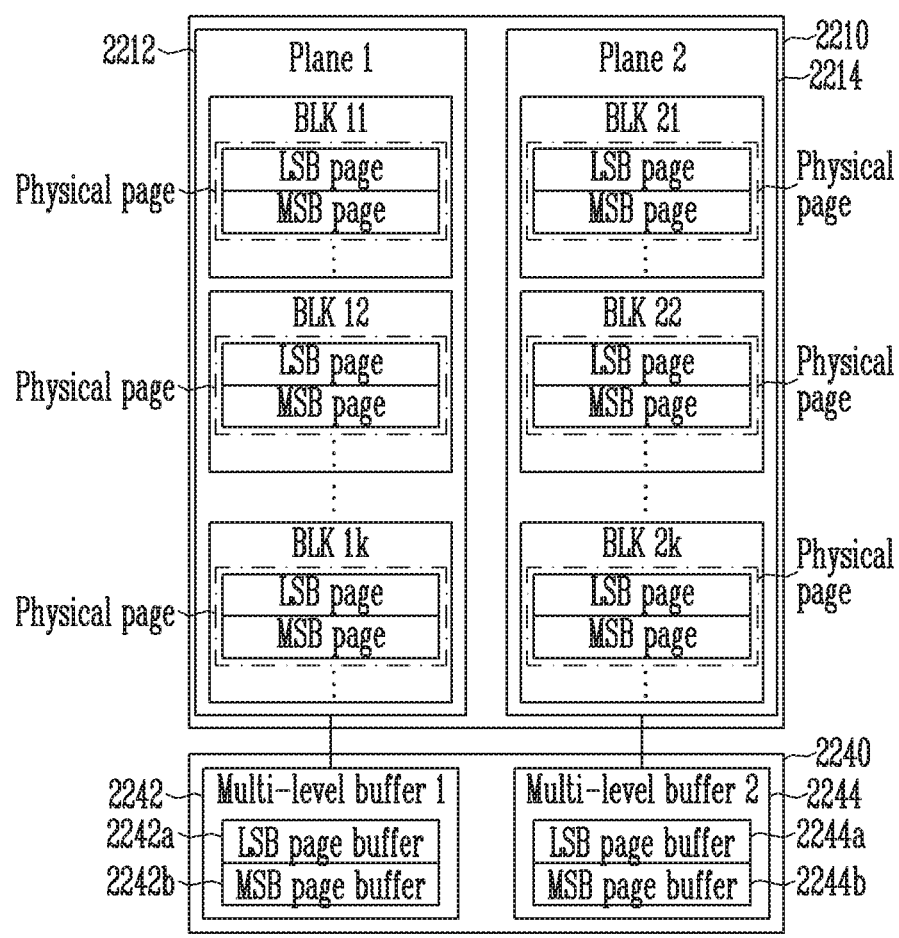
FIG. 3 is a diagram illustrating an example of a memory cell array and a multi-level buffer group, which are shown in FIG. 2.

FIG. 3 is a diagram illustrating the memory cell array and the multi-level buffer group, which are shown in FIG. 2.

The memory cell array 2210 may include a plurality of planes. Although an example in which two planes, i.e., plane 1 2212 and plane 2 2214 are included in the memory cell array 2210 is illustrated in FIG. 3, embodiments of the present disclosure are not limited thereto. For example, three or more planes may be included in the memory cell array 2210.

Each of the planes 2212 and 2214 may include a plurality of memory blocks. Although an example in which k memory blocks BLK 11 to BLK 1k and BLK 21 to BLK 2k are included in each of the planes 2212 and 2214 is illustrated in FIG. 3, embodiments of the present disclosure are not limited thereto. For example, a number of memory blocks included in the plane 1 2212 may be greater or less than that of memory blocks included in the plane 2 2214.

Each of the memory blocks BLK 11 to BLK 1k and BLK 21 to BLK 2k may include a plurality of physical pages. Numbers of physical pages included in the respective memory blocks BLK 11 to BLK 1k and BLK 21 to BLK 2k may be the same or may be different from each other.

Each of the physical pages may include a plurality of logical pages. For example, when each of the memory blocks BLK 11 to BLK 1k and BLK 21 to BLK 2k is an M-bit multi-level cell (MLC) block, each of the physical pages included in the memory blocks BLK 11 to BLK 1k and BLK 21 to BLK 2k may include M number of logical pages. Here, M may be a natural number. Although an example in which each of the memory blocks BLK 11 to BLK 1k and BLK 21 to BLK 2k is a 2-bit MLC block, i.e., an example in which two logical pages are included in each of the memory blocks BLK 11 to BLK 1k and BLK 21 to BLK 2k is illustrated in FIG. 3, embodiments of the present disclosure are not limited thereto. For example, each of the memory blocks BLK 11 to BLK 1k and BLK 21 to BLK 2k may be a 3-bit MLC block (referred to as a TLC block) or a 4-bit MLC block (referred to as a QLC block).

The multi-level buffer group 2240 may include multi-level buffers corresponding to each of the planes included in the memory cell array 2210. For example, when two planes 2212 and 2214 are included in the memory cell array 2210, the multi-level buffer group 2240 may include a first multi-level buffer 2242 corresponding to the plane 1 2212 and a second multi-level buffer 2244 corresponding to the plane 2 2214.

Each of the multi-level buffers 2242 and 2244 may include a plurality of logical page buffers. Although as illustrated in FIG. 3, an example in which two logical page buffers, i.e., a least significant bit (LSB) page buffer 2242a and a most significant bit (MSB) page buffer 2242b are included in the first multi-level buffer 2242, and two logical page buffers, i.e., an LSB page buffer 2244a and an MSB page buffer 2244b are included in the second multi-level buffer 2244, embodiments of the present disclosure are not limited thereto. For example, when each of the memory blocks BLK 11 to BLK 1k and BLK 21 to BLK 2k is an M-bit MLC block, logical page buffers having a number which corresponds to M number of logical pages may be included in each of the multi-level buffers 2242 and 2244. For example, when each of the memory blocks BLK 11 to BLK 1k and BLK 21 to BLK 2k is a 3-bit MLC block, three logical page buffers may be included in each of the multi-level buffers 2242 and 2244. When each of the memory blocks BLK 11 to BLK 1k and BLK 21 to BLK 2k is a 4-bit MLC block, four logical page buffers may be included in each of the multi-level buffers 2242 and 2244.

Each of the logical page buffers 2242a, 2242b, 2244a, and 2244b may store one piece of logical data. One logical page data may include the same number of data bits as a number of memory cells included in one physical page.

Figure 4:
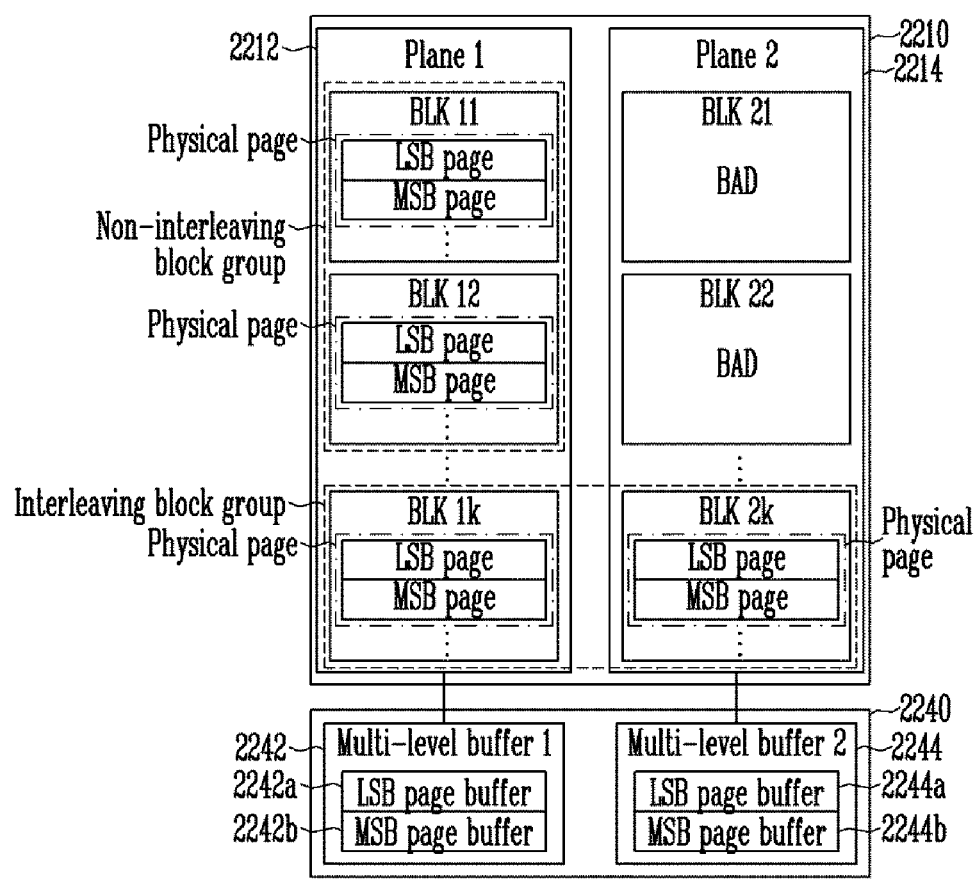
FIG. 4 is a diagram illustrating an interleaving block group and a non-interleaving block group in accordance with an embodiment of the present disclosure.

FIG. 4 is a diagram illustrating an interleaving block group and a non-interleaving block group in accordance with an embodiment of the present disclosure.

The memory cell array 2210 may include at least one interleaving block group and at least one non-interleaving block group.

The interleaving block group may include a number of memory blocks which corresponds to the number of planes included in the memory cell array 2210, and include one memory block among memory blocks included in each of the planes. Although an example in which a memory block BLK 1k included in the plane 1 2212 and a memory block BLK 2k included in the plane 2 2214 constitute one interleaving block group is illustrated in FIG. 4, embodiments of the present disclosure are not limited thereto. For example, when four planes are included in the memory cell array 2210, four memory blocks included in different planes may be included in one interleaving block group.

The non-interleaving block group may include a number of memory blocks which corresponds to the number of planes included in the memory cell array 2210, and include memory blocks included in any one plane in the memory cell array 2210. Although illustrated in FIG. 4, is an example in which memory blocks BLK 11 and BLK 12 included in the plane 1 2212 constitute one non-interleaving block group, embodiments of the present disclosure are not limited thereto. For example, when four planes are included in the memory cell array 2210, four memory blocks included in the same plane may be included in one non-interleaving block group.

At least one of the memory blocks included in the non-interleaving block group may be a substitution memory block for substituting a bad memory block. For example, at an early stage, memory blocks BLK 11 and BLK 21 may constitute one interleaving block group, and memory blocks BLK 12 and BLK 22 may constitute one interleaving block group. Subsequently, when the memory blocks BLK 21 and BLK 22 become bad memory blocks, the memory blocks BLK 11 and BLK 12 may constitute one non-interleaving block group.

Figure 5:
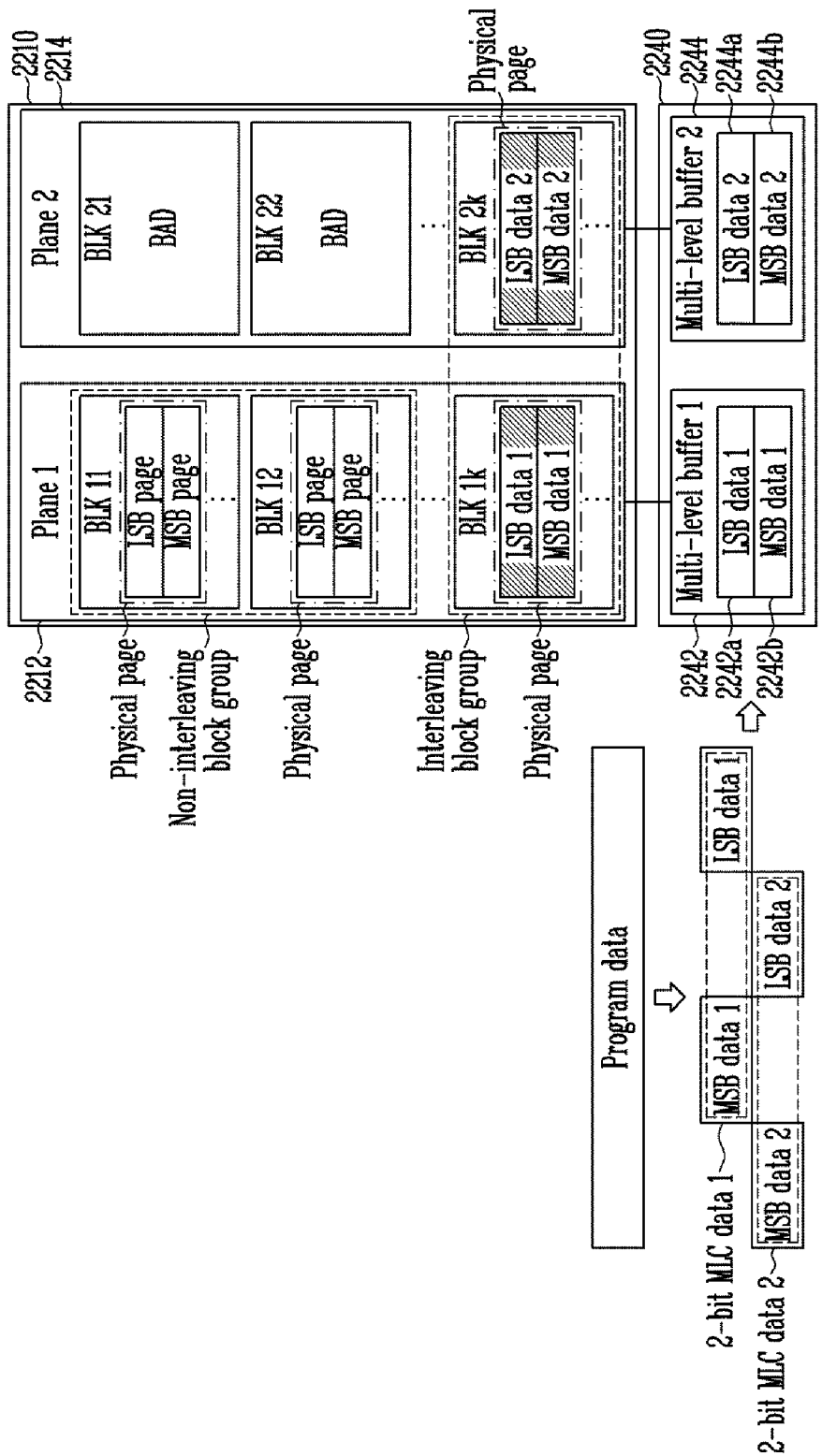
FIGS. 5 and 6 are diagrams illustrating a first program operation in accordance with an embodiment of the present disclosure.
Figure 6:
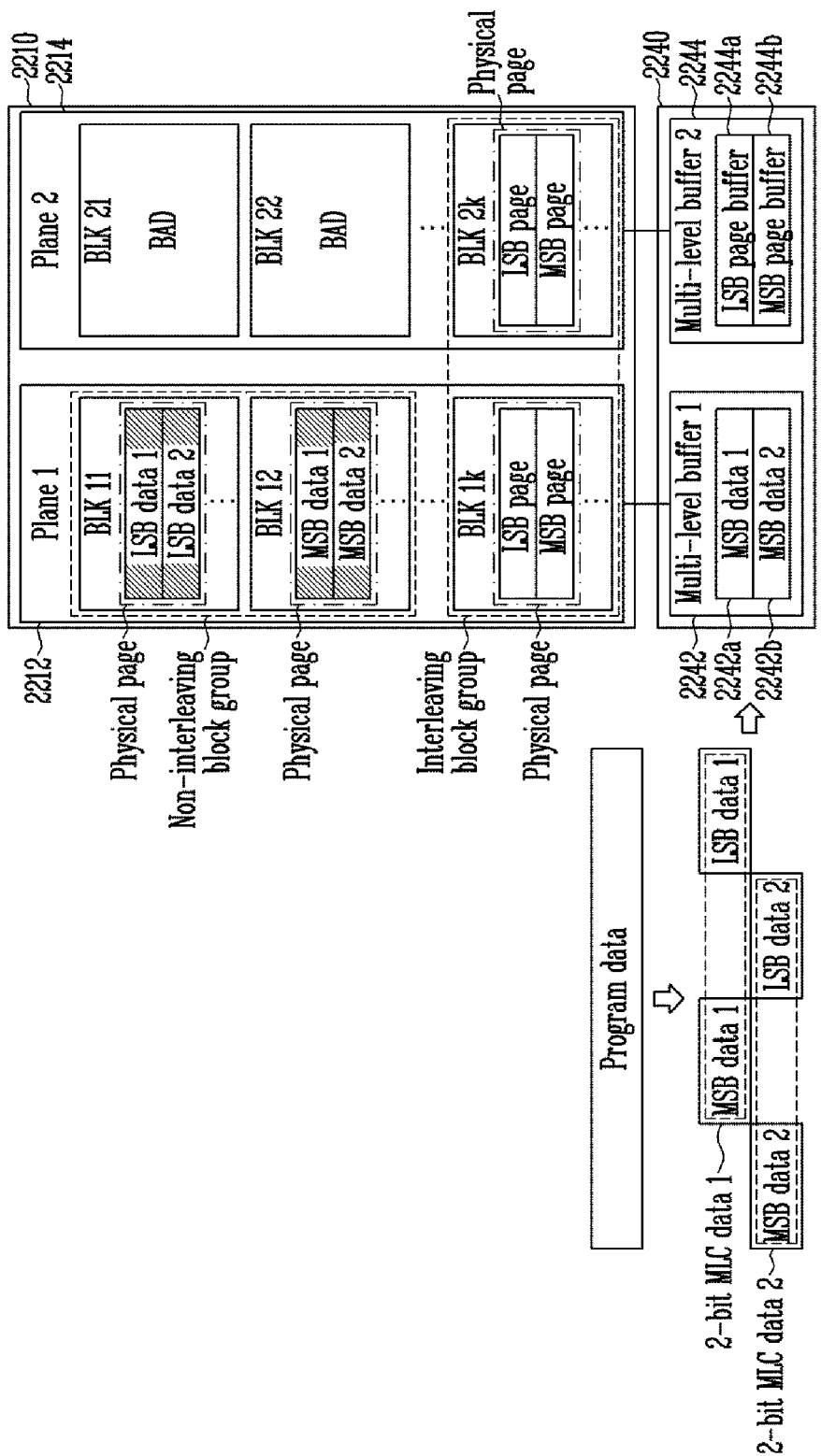

FIGS. 5 and 6 are diagrams illustrating the first program operation in accordance with an embodiment of the present disclosure.

In the first program operation, program data may be transmitted from the memory controller to a die.

When a number of planes included in the memory cell array 2210 of the die is N, and memory blocks included in the memory cell array 2210 are M-bit MLC blocks, the program data may be divided into N pieces of M-bit MLC data.

For example, when two planes 2212 and 2214 are included in the memory cell array 2210, and memory blocks BLK 11 to BLK 1k and BLK 21 to BLK 2k included in the memory cell array 2210 are 2-bit MLC blocks, the program data may be divided into two pieces of 2-bit MLC data, i.e., 2-bit MLC data 1 and 2-bit MLC data 2. The 2-bit MLC data 1 may include LSB data 1 and MSB data 1, and the 2-bit MLC data 2 may include LSB data 2 and MSB data 2.

An example in which the first program operation is performed on an interleaving block group including memory blocks BLK 1k and BLK 2k is illustrated in FIG. 5. When the interleaving block group is selected in the first program operation, the program data received from the memory controller may be stored in the multi-level buffer group 2240 by using an interleaving scheme.

When the program data is stored using the interleaving scheme, plural pieces of logical page data included in the program data may be sequentially stored from an LSB page buffer to an MSB page buffer among the logical page buffers included in the multi-level buffer groups, according to a sequence in which the plural pieces of logical page data are received. For example, when LSB data 1, LSB data 2, MSB data 1, and MSB data 2 are sequentially received in the program data, the LSB data 1 may be stored in the LSB page buffer 2242a of the first multi-level buffer 2242, the LSB data 2 may be stored in the LSB page buffer 2244a of the second multi-level buffer 2244, the MSB data 1 may be stored in the MSB page buffer 2242b of the first multi-level buffer 2242, and the MSB data 2 may be stored in the MSB page buffer 2244b of the second multi-level buffer 2244.

The program data stored in the multi-level buffer group 2240 may be programmed in the memory blocks BLK 1k and BLK 2k included in the interleaving block group by the first program operation. The first program operation may mean an operation of programming plural pieces of logical page data stored in a multi-level buffer to one physical page. FIG. 5 illustrates an example in which the LSB data 1 and the MSB data 1 in the first multi-level buffer 2242 are programmed to a selected physical page in the memory block BLK 1k and the LSB data 2 and the MSB data 2 in the second multi-level buffer 2244 are programmed to a selected physical page in the memory block BLK 2k.

In the example shown in FIG. 5, the logical page data LSB data 1 and MSB data 1 included in the 2-bit MLC data 1 are programmed to the same physical page in the memory block BLK 1k, and the logical page data LSB data 2 and MSB data 2 included in the 2-bit MLC data 2 are programmed to the same physical page in the memory block BLK 2k.

FIG. 6 illustrates an example in which the first program operation is performed on a non-interleaving block group including memory blocks BLK 11 and BLK 12. When the non-interleaving block group is selected in the first program operation, program data received from the memory controller may be stored in a multi-level buffer corresponding to the non-interleaving block group.

For example, plural pieces of logical page data included in the program data may be sequentially stored from a LSB page buffer to a MSB page buffer within the multi-level buffer corresponding to the non-interleaving block group.

For example, when LSB data 1 and LSB data 2 are sequentially received among the plural pieces of logical page data included in the program data, the LSB data 1 may be stored in the LSB page buffer 2242a of the first multi-level buffer 2242, and the LSB data 2 may be stored in the MSB page buffer 2242b of the first multi-level buffer 2242. Subsequently, the logical page data LSB data 1 and LSB data 2 stored in the first multi-level buffer 2242 may be programmed to a selected memory block among the memory blocks BLK 11 and BLK 12 included in the non-interleaving block group by the first program operation. An example in which the logical page data LSB data 1 and LSB data 2 are programmed to the memory block BLK 11 is illustrated in FIG. 6.

Meanwhile, the other logical page data MSB data 1 and MSB data 2 may be sequentially stored from a LSB page buffer to a MSB page buffer within a multi-level buffer corresponding to the non-interleaving block group. For example, when the MSB data 1 and the MSB data 2 are sequentially received among remaining pieces of logical page data, the MSB data 1 may be stored in the LSB page buffer 2242a of the first multi-level buffer 2242, and the MSB data 2 may be stored in the MSB page buffer 2242b of the first multi-level buffer 2242. Subsequently, the logical page data MSB data 1 and MSB data 2 stored in the first multi-level buffer 2242 may be programmed to a memory block selected from the memory blocks BLK 11 and BLK 12 included in the non-interleaving block group by the first program operation. An example in which the logical page data MSB data 1 and MSB data 2 are programmed to the memory block BLK 12 is illustrated in FIG. 6.

In the example shown in FIG. 6, when the logical page data LSB data 1 and MSB data 1 included in the 2-bit MLC data 1 are programmed to different physical pages, and the logical page data LSB data 2 and MSB data 2 included in the 2-bit MLC data 2 are programmed to different physical pages, data different from the original program data may be read in a read operation. To address this problem, the memory controller changes the sequence of the plural pieces of logical data for a program operation on a non-interleaving block group.

Figure 7:
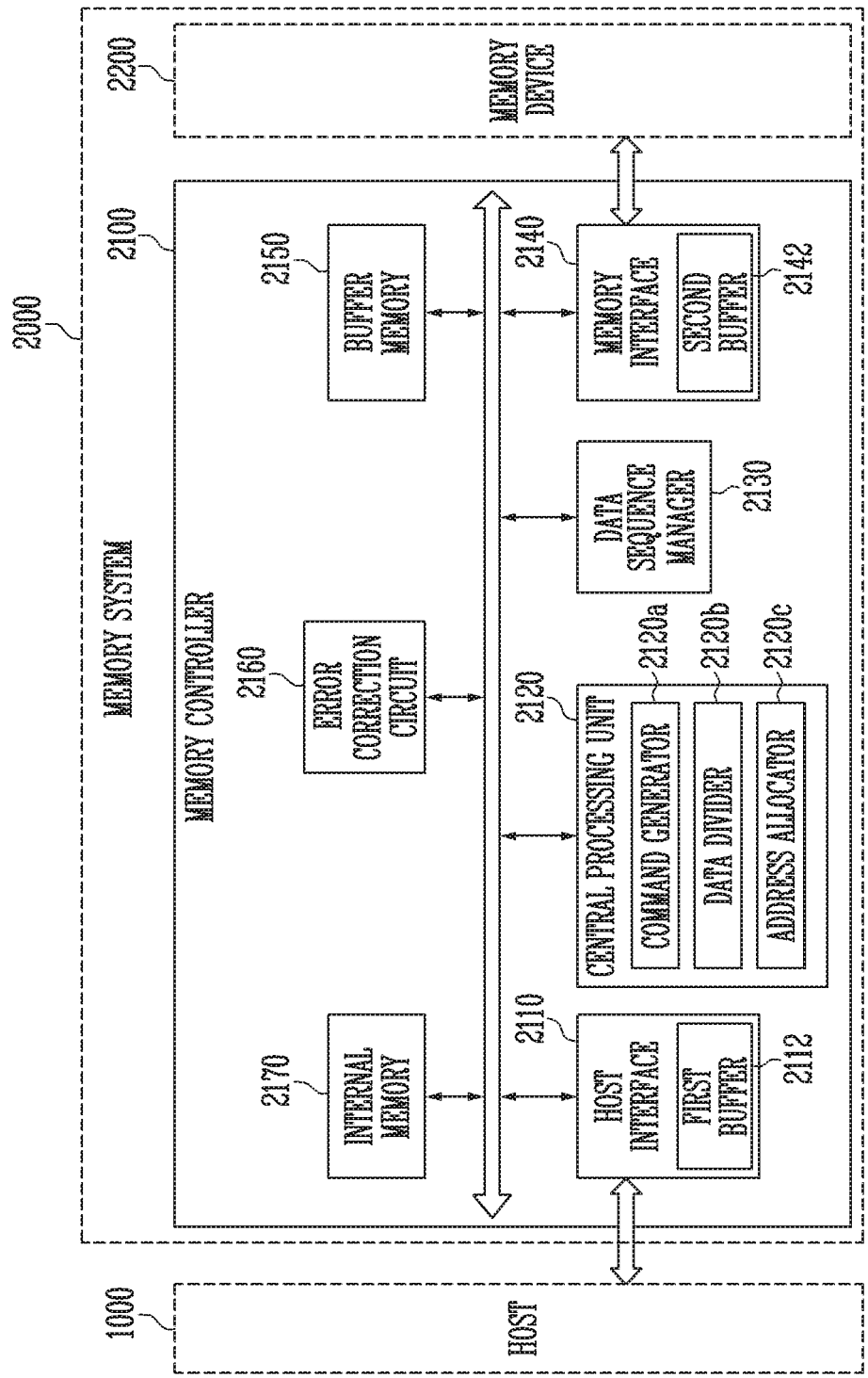
FIG. 7 is a diagram illustrating an example of a memory controller shown in FIG. 1.

FIG. 7 is a diagram illustrating the memory controller shown in FIG. 1.

The memory controller 2100 may include at least one of a host interface 2110, a central processing unit 2120, a data sequence manager 2130, a memory interface 2140, a buffer memory 2150, an error correction circuit 2160, and an internal memory 2170. The host interface 2110, the data sequence manager 2130, the memory interface 2140, the buffer memory 2150, the error correction circuit 2160, and the internal memory 2170 may be controlled by the central processing unit 2120.

The host interface 2110 may transfer a program request, a read request, an erase request, and the like, which are received from the host 1000, to the central processing unit 2120. In a program operation, program data received from the host 1000 may be temporarily stored in a first buffer 2112. The program data stored in the first buffer 2112 may be queued in a second buffer 2142 included in the memory interface 2140 under the control of the data sequence manager 2130. The second buffer 2142 may queue the program data that is transferred from the first buffer 2112 through the data sequence manager 2130, the commands generated from the command generator 2120a, and the physical addresses of the program data allocated by the address allocator 2120c.

The host interface 2110 may perform communication with the host 1000 by using various interface protocols. For example, the host interface 2110 may communicate with the host 1000 by using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer System Interface (SCSI), or a Serial Attached SCSI (SAS). However, embodiments of the present disclosure are not limited thereto.

The central processing unit 2120 may include a command generator 2120a, a data divider 2120b, and an address allocator 2120c.

The command generator 2120a may generate a command to control the memory device 2200. For example, the command generator 2120a may generate a command necessary for a program, read or erase operation in response to a request received from the host 1000 through the host interface 2110. The command generator 2120a may queue the generated command in the second buffer 2142 included in the memory interface 2140.

The data divider 2120b may divide program data temporarily stored in the first buffer 2112 into N pieces of M-bit MLC data. Also, the data divider 2120b may divide each of the N pieces of M-bit MLC data into M pieces of logical page data. That is, the data divider 2120b may divide the program data into N groups of M pieces of logical page data. Here, N may represent a number of planes included in a die. For example, when the number of planes included in the die is 2, and memory blocks included in the planes are 2-bit MLC blocks, the program data may be two pieces of 2-bit MLC data, and each of the 2-bit MLC data may be divided into LSB data and MSB data. That is, the program data may be divided into 2 (n=2) groups of 2 (m=2) pieces (i.e., LSB and MSB data) of logical page data. For example, when the number of planes included in the die is 2, and memory blocks included in the planes are 3-bit MLC blocks, the program data may be divided into two 3-bit MLC data, and each of the two 3-bit MLC data may be divided into LSB data, central significant bit (CSB) data, and MSB data. That is, the program data may be divided into 2 (n=2) groups of 3 (m=3) pieces (i.e., LSB, CSB and MSB data) of logical page data. For example, when the number of planes included in the die is 4, and memory blocks included in the planes are 2-bit MLC blocks, the program data may be divided into four pieces of 2-bit MLC data, and each of the four pieces of 2-bit MLC data may be divided into LSB data and MSB data. That is, the program data may be divided into 4 (n=4) groups of 2 (m=2) pieces (i.e., LSB and MSB data) of logical page data.

The data divider 2120b may provide the data sequence manager 2130 with information on the N groups of M pieces of logical page data. For example, the information on the N groups of M pieces of logical page data may include information on a position at which each piece of the logical page data is stored in the first buffer 2112. Also, the information on the N groups of M pieces of logical page data may include information on each piece of the logical page data. For example, the information on the N groups of M pieces of logical page data may include at least one of information on a group including each piece of the logical page data among the N groups (the N groups respectively corresponding to the N planes or the N pieces of M-bit MLC data) and information on whether each piece of the logical page data corresponds to LSB page, CSB page or MSB page (the M pieces respectively corresponding to m-level bits within a single piece of M-bit MLC data).

The address allocator 2120c may determine memory blocks to which N pieces of M-bit MLC data are to be programmed, and allocate addresses corresponding to the determined memory blocks, corresponding to the N pieces of M-bit MLC data. Here, N may represent a number of planes included in a die. For example, when the number of planes included in the die is 2, and memory blocks included in the planes are 2-bit MLC blocks, the address allocator 2120c may determine a first MLC block to which 2-bit MLC data 1 selected from two pieces of 2-bit MLC data is to be programmed, and determine a second MLC block to which 2-bit MLC data 2 selected from the two pieces of 2-bit MLC data is to be programmed. The address allocator 2120c may allocate addresses corresponding to the determined MLC blocks, corresponding to the N pieces of M-bit MLC data.

The address allocator 2120c may refer to an address mapping table to allocate addresses. The address mapping table may include mapping information between physical addresses of memory blocks included in the memory device 2200 and logical addresses corresponding to the respective physical addresses. For example, the address allocator 2120c may determine physical addresses of N number of memory blocks to which N pieces of M-bit MLC data are to be programmed among physical addresses to which logical addresses are not mapped with reference to the address mapping table, and allocate the determined physical addresses, corresponding to the N pieces of M-bit MLC data. The address mapping table may be loaded into the internal memory 2170 from the memory device 2200, and an address mapping table updated in the internal memory 2170 may be stored in the memory device 2200. The address mapping table may be updated when a program operation or erase operation is performed.

In an embodiment, when physical addresses of N number of memory blocks to which N pieces of M-bit MLC data are to be programmed are determined, the address allocator 2120c may check whether there exists a physical address corresponding to a bad memory block among the determined physical addresses. For example, the address allocator 2120c may check whether each of the determined physical addresses corresponds to a bad memory block, with reference to a bad memory block table. The bad memory block table may include a physical address corresponding to a bad memory block determined at an earlier stage or in use of the memory system 2000, and a physical address corresponding to a substitution memory block for the bad memory block. The bad memory block table may be managed by the central processing unit 2120. When the determined physical address corresponds to a bad memory block, the address allocator 2120c may correct the determined physical address to a physical address corresponding to the substitution memory block for the bad memory block. That is, the address allocator 2120c may allocate a physical address corresponding to the substitution memory block, corresponding to at least one of the N pieces of M-bit MLC data.

The address allocator 2120c may queue the allocated physical addresses in the second buffer 2142 included in the memory interface 2140.

The data sequence manager 2130 may control the first buffer 2112 and the second buffer 2142 such that program data temporarily stored in the first buffer 2112 is queued in the second buffer 2142. The data sequence manager 2130 may determine a sequence in which plural pieces of logical page data included in the program data are to be queued in the second buffer 2142. The sequence in which the plural pieces of logical page data are to be queued in the second buffer 2142 may be identical to a transmission sequence in which the plural pieces of logical page data queued in the second buffer 2142 are transmitted to the memory device 2200.

For example, the data sequence manager 2130 may check whether physical addresses queued in the second buffer 2142 from the address allocator 2120c correspond to the same plane, by monitoring the corresponding physical addresses. For example, each of the physical addresses may be expressed as a bit-sequence (physical address bit sequence), and the physical address bit-sequence may include bits representing a die address (die address bits), bits representing a plane address (plane address bits), and bits representing a memory block address (memory block address bits). The data sequence manager 2130 may compare the plane address bits of each of the physical address bit-sequences, to determine whether or not the checked plane address bits are the same. This way, the data sequence manager 2130 may determine whether the plane address bits of a first physical address and the plane address bits of a second physical address, are the same.

When the checked bits are the same, this means that the physical addresses queued in the second buffer 2142 correspond to the same plane. When the checked bits are not the same, this means that the physical addresses queued in the second buffer 2142 correspond to different planes.

When the physical addresses correspond to the same plane then means that a non-interleaving block group is selected to program the N pieces of M-bit MLC data represented by the physical addresses. When the physical addresses correspond to different planes then an interleaving block group is selected to program the N pieces of M-bit MLC data represented by the physical addresses.

The data sequence manager 2130 may differently determine a transmission sequence of plural pieces of logical page data included in the program data stored in the first buffer 2112, according to whether an interleaving block group or a non-interleaving block group is selected.

When an interleaving block group is selected, the data sequence manager 2130 may determine a transmission sequence of logical page data such that the plural pieces of logical page data included in the program data stored in the first buffer 2112 are sequentially queued in the second buffer 2142.

For example, when the interleaving block group is selected, the data sequence manager 2130 may determine a transmission sequence such that, with respect to 2 groups of M pieces of logical page data included in first and second M-bit MLC data within the program data stored in the first buffer 2112, a piece of logical page data corresponding to a lower-level logical page is queued prior to a piece of logical page data corresponding to a higher-level logical page.

For example, in 2-bit MLC data, LSB page data corresponds to a lower-level logical page and MSB page data corresponds to a higher-level logical page.

For example, in 3-bit MLC data, LSB page data corresponds to a lower-level logical page than logical pages corresponding to CSB page data and MSB page data. For example, in 3-bit MLC data, CSB page data corresponds to a lower-level logical page than logical page corresponding to MSB page data and corresponds to a higher-level logical page than the logical page corresponding to LSB page data. This will be described in more detailed in the embodiment described with reference to FIG. 8.

When the non-interleaving block group is selected, the data sequence manager 2130 may determine a transmission sequence of plural pieces of logical page data such that a sequence of some pieces of logical page data is changed among the plural pieces of logical page data included in the program data stored in the first buffer 2112. The plural pieces of logical page data of the changed sequence for a program operation on a non-interleaving block group may be queued in the second buffer 2142.

For example, when the non-interleaving block group is selected, the data sequence manager 2130 may determine a transmission sequence such that N pieces of M-bit MLC data included in the program data stored in the first buffer 2112 are sequentially queued in the second buffer 2142. The data sequence manager 2130 may determine a transmission sequence such that, with respect to M pieces of logical page data included in each of the M-bit MLC data, a piece of logical page data corresponding to a lower-level logical page is queued prior to a piece of logical page data corresponding to a higher-level logical page. This will be described in more detail in the embodiment described with reference to FIG. 9.

The data sequence manager 2130 may determine a transmission sequence of the logical page data included in the program data, and refer to information on N groups of M pieces of logical page data, which are received from the data divider 2120*b* so as to queue the logical page data in the second buffer 2142 according to the determined transmission sequence.

The memory interface 2140 may perform communication with the memory device 2200 by using various interface protocols. The memory interface 2140 may include the second buffer 2142. The second buffer 2142 may sequentially queue a command and addresses, which are received from the central processing unit 2120. In a program operation, the second buffer 2142 may sequentially queue logical page data received from the first buffer 2112 under the control of the data sequence manager 2130. The second buffer 2142 may sequentially output the queued command, addresses, and logical page data to the memory device 2200 according to the queued sequence.

The buffer memory 2150 may temporarily store data while the memory controller 2100 is controlling the memory device 2200.

The error correction circuit 2160 may perform error correction encoding in a program operation, and perform error correction decoding in a read operation.

The internal memory 2170 may be used as a storage for storing various information necessary for an operation of the memory controller 2100. For example, the address mapping table and the bad memory block table may be loaded into the internal memory 2170.

Figure 8:
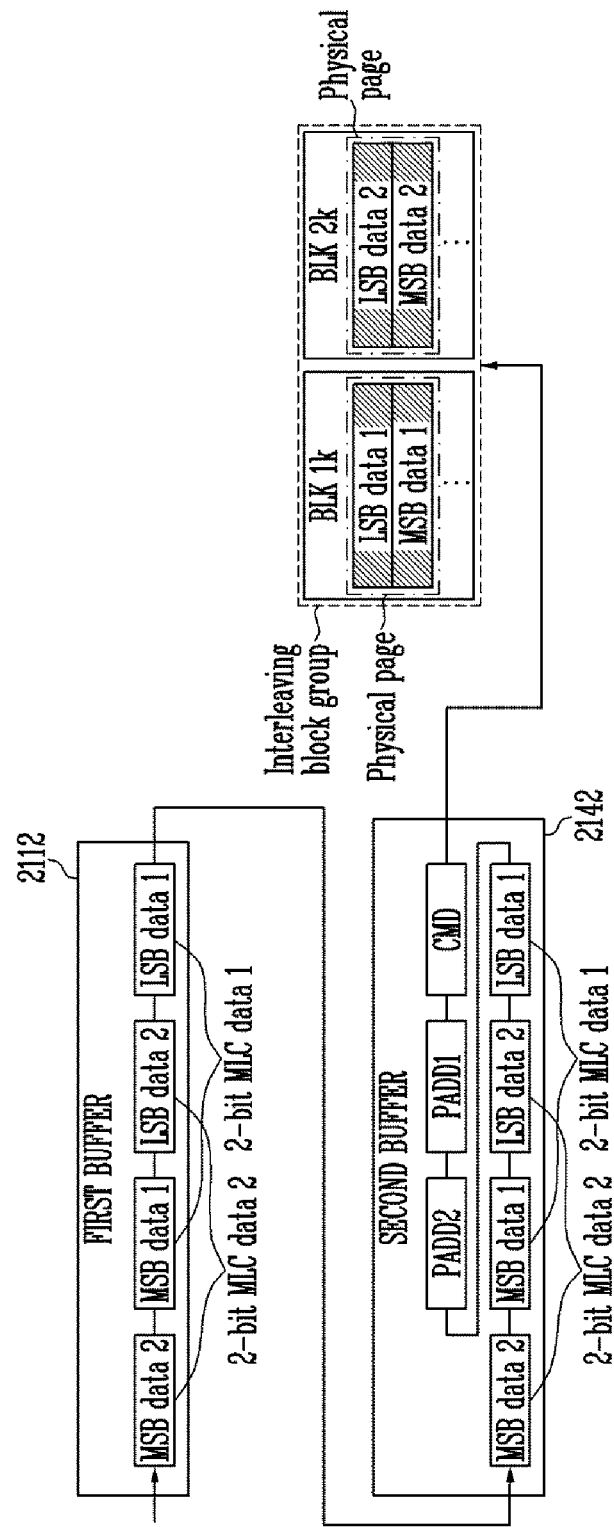
FIG. 8 is a diagram illustrating program data programmed in an interleaving block group in accordance with an embodiment of the present disclosure.

FIG. 8 is a diagram illustrating program data programmed in an interleaving block group in accordance with an embodiment of the present disclosure.

In FIG. 8, program data are programmed to one interleaving block group including 2-bit MLC blocks BLK 1*k* and BLK 2*k* from different planes.

When two 2-bit MLC blocks BLK 1*k* and BLK 2*k* are included in one interleaving block group, program data temporarily stored in the first buffer 2112 may be divided into two pieces of 2-bit MLC data, i.e., 2-bit MLC data 1 and 2-bit MLC data 2. In addition, the 2-bit MLC data 1 may be divided into 2 pieces of logical page data, i.e., LSB data 1 and MSB data 1; and the 2-bit MLC data 2 may be divided into 2 pieces of logical page data, i.e., LSB data 2 and MSB data 2.

Moreover, a command CMD and physical addresses PADD 1 and PADD 2 may be sequentially queued in the second buffer 2142. The physical address PADD 1 may correspond to the 2-bit MLC block to which the 2-bit MLC data 1 is to be programmed, and the physical address PADD 2 may correspond to the 2-bit MLC block to which the 2-bit MLC data 2 is to be programmed.

After the command CMD and the physical addresses PADD 1 and PADD 2 are queued in the second buffer 2142, logical page data included in the program data may be queued in the second buffer 2142. The logical page data included in the program data may be sequentially queued in the second buffer 2142. For example, as shown in FIG. 8, the logical page data may be queued in the second buffer 2142 in a sequence of the LSB data 1, the LSB data 2, the MSB data 1, and the MSB data 2.

The logical page data queued in the second buffer 2142 may be output to a die in the queued sequence, and be programmed to the memory blocks BLK 1*k* and BLK 2*k* included in the interleaving block group according to the first program operation.

Figure 9:
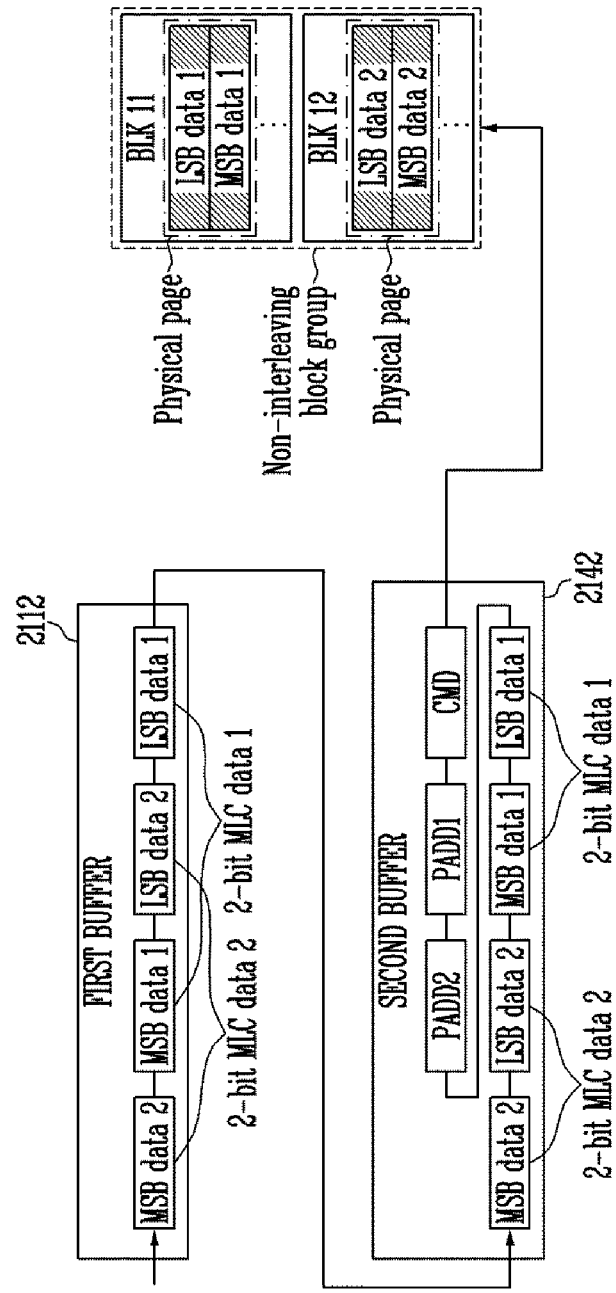
FIG. 9 is a diagram illustrating program data programmed in a non-interleaving block group in accordance with an embodiment of the present disclosure.

FIG. 9 is a diagram illustrating program data programmed in a non-interleaving block group in accordance with an embodiment of the present disclosure.

In FIG. 9, program data are programmed in one non-interleaving block group including memory blocks BLK 11 and BLK 12 included in the same plane among 2-bit MLC blocks included in two planes.

Like the embodiment described with reference to FIG. 8, program data temporarily stored in the first buffer 2112 may be divided into plural pieces of logical page data LSB data 1, LSB data 2, MSB data 1, and MSB data 2.

Also, like the embodiment described with reference to FIG. 8, a command and physical addresses PADD 1 and PADD 2 may be sequentially queued in the second buffer 2142. The physical address PADD 1 may correspond to a 2-bit MLC block to which 2-bit MLC data 1 is to be programmed, and the physical address PADD 2 may correspond to a 2-bit MLC block to which 2-bit MLC data 2 is to be programmed.

After the command CMD and the physical addresses PADD 1 and PADD 2 are queued in the second buffer 2142, the logical page data included in the program data may be queued in the second buffer 2142. The plural pieces of logical page data of a changed sequence for a program operation on a non-interleaving block group may be queued in the second buffer 2142. For example, the transmission sequence may be determined such that the logical page data LSB data 1 and MSB data 1 included in the 2-bit MLC data 1 is transmitted prior to the logical page data LSB data 2 and MSB data 2 included in the 2-bit MLC data 2. The logical page data included in the 2-bit MLC data 1 may be queued in the second buffer 2142 prior to the logical page data included in the 2-bit MLC data 2. With respect to the logical page data included in each of the 2-bit MLC data, the transmission sequence may be determined such that a piece of logical page data corresponding to a lower-level logical page is transmitted prior to a piece of logical page data corresponding to a higher-level logical page. The LSB data 1 may be queued in the second buffer 2142 prior to the MSB data 1, and the LSB data 2 may be queued in the second buffer 2142 prior to the MSB data 2.

The logical page data queued in the second buffer 2142 may be output to a die in the queued sequence, and be programmed to the memory blocks BLK 11 and BLK 12 included in the non-interleaving block group according to the first program operation.

In the example shown in FIG. 9, it can be seen that the logical page data LSB data 1 and MSB data 1 included in the 2-bit MLC data 1 are programmed to the same physical page, and the logical page data LSB data 2 and MSB data 2 included in the 2-bit MLC data 2 are programmed to the same physical page. Therefore, unlike the embodiment described with reference to FIG. 6, the same data as the original program data may be read in a read operation.

Figure 10:
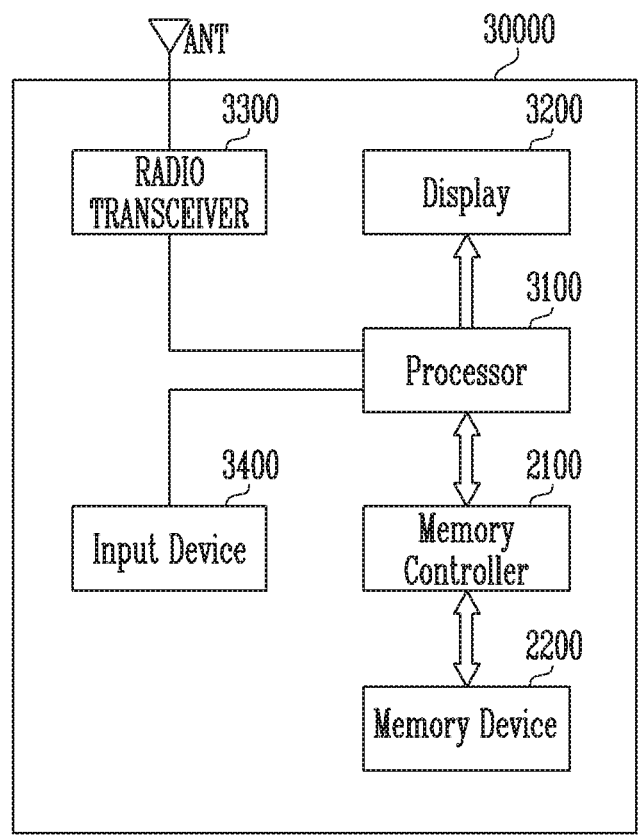
FIGS. 10 to 13 are diagrams illustrating other memory systems including the memory controller shown in FIGS. 1 and 7 in accordance with an embodiment of the present disclosure.

FIG. 10 is a diagram illustrating another example of the memory system including the memory controller shown in FIGS. 1 and 7.

Referring to FIG. 10, the memory system 30000 may be implemented as a cellular phone, a smart phone, a tablet, a personal computer (PC), a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 11:
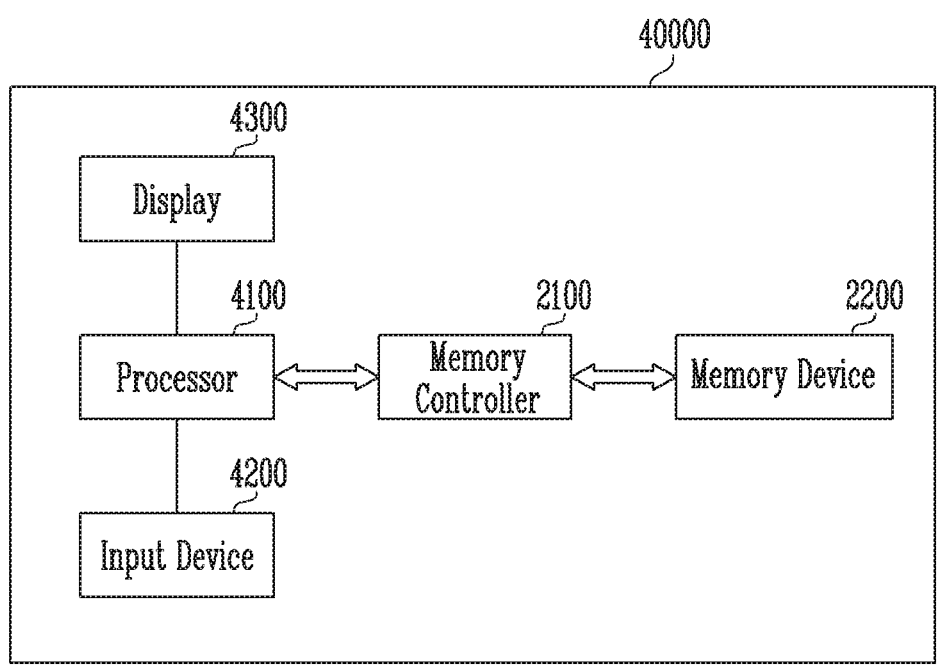

FIG. 11 is a diagram illustrating another example of the memory system including the memory controller shown in FIGS. 1 and 7.

Referring to FIG. 11, the memory system 40000 may be implemented as a personal computer (PC), a tablet, a netbook, an e-reader, a personal digital assistant (PDA), a portable multi-media player (PMP), an MP3 player, or an MP4 player.

The memory system 40000 may include a memory device 2200 configured to store data and a memory controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the memory controller 2100. In some embodiments, the memory controller 2100 capable of controlling an operation of the memory device 2200 may be implemented as a part of the processor 4100, or be implemented as a chip separate from the processor 4100.

Figure 12:
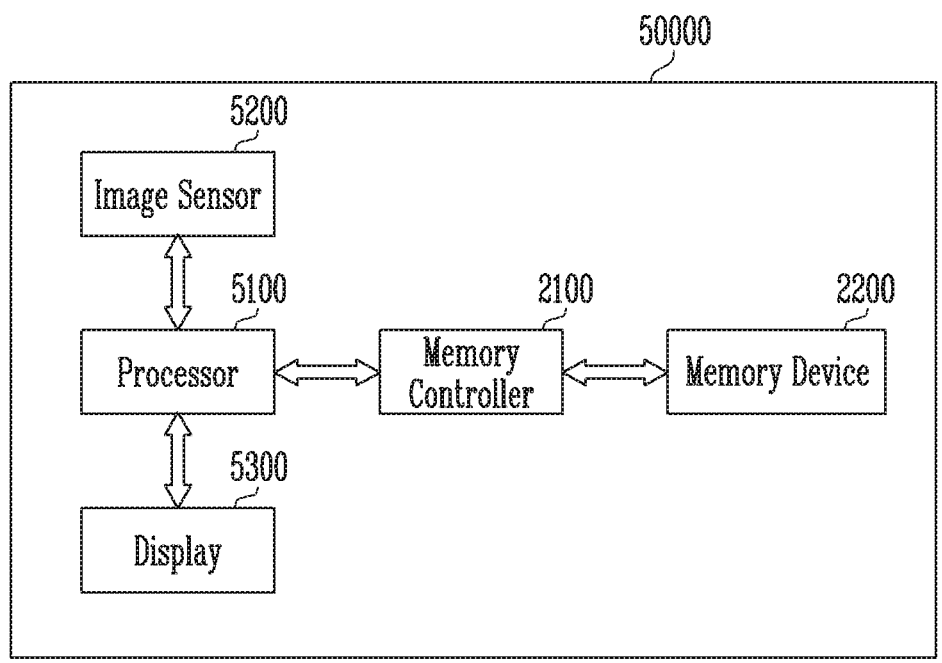

FIG. 12 is a diagram illustrating another example of the memory system including the memory controller shown in FIGS. 1 and 7.

Referring to FIG. 12, the memory system 50000 may be implemented as an image processing device, e.g., a digital camera, a cellular phone having a digital camera attached thereto, a smart phone having a digital camera attached thereto, or a tablet having a digital camera attached thereto.

The memory system 50000 may include a memory device 2200 and a memory controller 2100 capable of controlling a data processing operation of the memory device 2200, e.g., a program operation, an erase operation, or a read operation.

An image sensor 5200 of the memory system 50000 may change an optical image into digital signals, and the changed digital signals may be transmitted to a processor 5100 or the memory controller 2100. Under the control of the processor 5100, the changed digital signals may be output through a display 5300, or be stored in the memory device 2200 through the memory controller 2100. In addition, data stored in the memory device 2200 may be output through the display 5300 under the control of the processor 5100 or the memory controller 2100.

In some embodiments, the memory controller 2100 capable of controlling an operation of the memory device 2200 may be implemented as a part of the processor 5100, or be implemented as a chip separate from the processor 5100.

Figure 13:
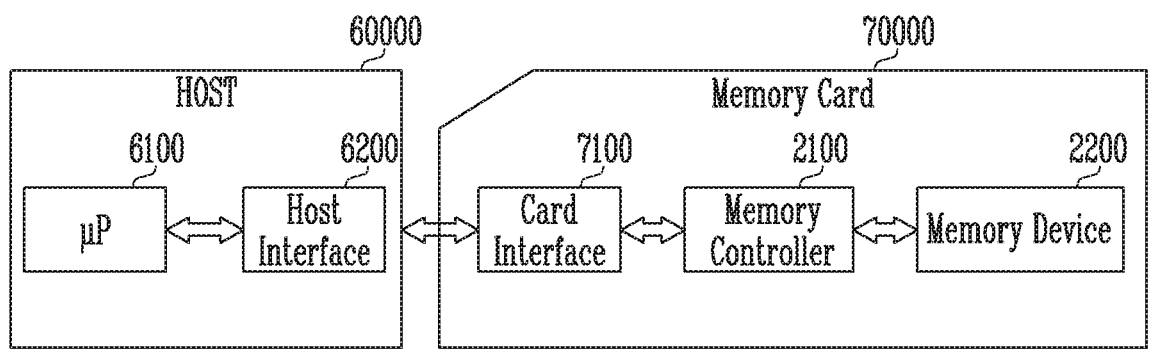

FIG. 13 is a diagram illustrating another example of the memory system including the memory controller shown in FIGS. 1 and 7.

Referring to FIG. 13, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor (μP) 6100.

In accordance with the present disclosure, the same data as program data can be read in a read operation.

Embodiments of the present invention have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present disclosure as defined in the appended claims and their equivalents.

What is claimed is:
1. A memory system comprising:
 a memory device comprising a plurality of planes each comprising a plurality of memory blocks, and a plurality of multi-level buffers corresponding to the plurality of planes; and
 a memory controller configured to:
 in response to a first page data set and a second page data set being received, allocate a first address corresponding to a first memory block among the plurality of memory blocks to the first page data set and a second address corresponding to a second memory block among the plurality of memory blocks to the second page data set;

if a plane indicated by the first address is different from a plane indicated by the second address, transmit the first page data set to a first multi-level buffer corresponding to the plane indicated by the first address, among the plurality of multi-level buffers, and transmit the second page data set to a second multi-level buffer corresponding to the plane indicated by the second address, among the plurality of multi-level buffers; and if the plane indicated by the first address is the same as the plane indicated by the second address, sequentially transmit the first page data set and the second page data set to the first multi-level buffer corresponding to the plane indicated by the first address and the second address, among the plurality of multi-level buffers.

2. The memory system of claim 1, wherein the memory controller includes:
a first buffer configured to store the first and second page data sets received from a host;
an address allocator configured to allocate the first and second addresses to the first and second page data sets;
a second buffer configured to sequentially store a plurality of logical page data included in the first and second page data sets and output the plurality of logical page data to the memory device according to a sequence in which the plurality of logical page data is stored; and
a data sequence manager configured to determine a transmission sequence, and queue the plurality of logical page data in the second buffer according to the transmission sequence.

3. The memory system of claim 2, wherein the data sequence manager is configured to, if the plane indicated by the first address is the same as the plane indicated by the second address, determine the transmission sequence such that the plurality of logical page data included in the first page data set is transmitted prior to the plurality of logical page data included in the second page data sets.

4. The memory system of claim 3, wherein each of the first and second page data sets comprises LSB (least significant bit) data and MSB (most significant bit) data as the plurality of logical page data, and
wherein the data sequence manager is configured to determine, with respect to the each of the first and second page data sets, the transmission sequence such that logical page data corresponding to a lower level is transmitted prior to logical page data corresponding to a higher level between the LSB data and the MSB data.

5. The memory system of claim 2, wherein each of the first and second page data sets comprises LSB (least significant bit) data and MSB (most significant bit) data as the plurality of logical page data, and
wherein the data sequence manager is configured to, if the plane indicated by the first address is different from the plane indicated by the second address, determine, with respect to the each of the first and second page data sets, the transmission sequence so that logical page data corresponding to a lower level is transmitted prior to logical page data corresponding to a higher level between the LSB data and the MSB data.

6. The memory system of claim 2,
wherein the second buffer is configured to output the first and second addresses to the memory device according to a sequence in which the addresses are queued,
wherein the data sequence manager is configured to queue the first address in the second buffer prior to the second address.

7. The memory system of claim 2, wherein the memory device includes:
an input/output circuit configured to receive the first and second addresses and the plurality of logical page data from the memory controller; and
a control logic configured to sequentially store the plurality of logical page data in the first multi-level buffer or the second multi-level buffer according to the first and second addresses.

8. The memory system of claim 7, wherein the control logic is configured to, if the plane indicated by the first address is the same as the plane indicated by the second address, sequentially store the plurality of logical page data received from the memory controller in the first multi-level buffer.

9. The memory system of claim 8, wherein the control logic is configured to:
sequentially program previous M pieces of the plurality of logical page data stored in the first multi-level buffer to a single physical page of the first memory block corresponding to the first address; and
sequentially program subsequent M pieces of the plurality of logical page data stored in the first multi-level buffer to a single physical page of the second memory block corresponding to the second address.

10. The memory system of claim 7, wherein the control logic is configured to, if the plane indicated by the first address is different from the plane indicated by the second address:
sequentially store M pieces of logical page data received in an odd-numbered order among the plurality of logical page data in the first multi-level buffer; and
sequentially store M pieces of logical page data received in an even-numbered order among the plurality of logical page data in the second multi-level buffer.

11. The memory system of claim 10, wherein the control logic is configured to:
sequentially program the M pieces of logical page data stored in the first multi-level buffer to one physical page included in the first memory block corresponding to the first address; and
sequentially program the M pieces of logical page data stored in the second multi-level buffer to one physical page included in the second memory block corresponding to the second address.

12. A memory controller for controlling a memory device including first and second planes each including a plurality of memory blocks, the memory controller comprising:
a first buffer configured to store program data received from a host;
a data divider configured to divide the program data into first and second page data sets each including a plurality of logical page data;
an address allocator configured to allocate a first address corresponding to a first memory block among the plurality of memory blocks to the first page data set, and a second address corresponding to a second memory block among the plurality of memory blocks to the second page data set;
a second buffer configured to output the plurality of logical page data to the memory device according to a transmission sequence in which the plurality of logical page data is queued; and
a data sequence manager configured to:

if the first address indicates the first plane and the second address indicates the second plane, determine a first transmission sequence to transmit the first page data set to a first multi-level buffer of the memory device corresponding to the first plane, and to transmit the second page data set to a second multi-level buffer of the memory device corresponding to the second plane, as the transmission sequence; and if the first address indicates the first plane and the second address indicates the first plane, determine a second transmission sequence to sequentially transmit the first page data set and the second page data set to the first multi-level buffer, as the transmission sequence.

13. The memory controller of claim 12,
wherein the second buffer is configured to output the first and second addresses to the memory device according to a sequence in which the addresses are queued,
wherein the data sequence manager is configured to queue the first address in the second buffer prior to the second address.

14. The memory controller of claim 12, wherein, the data sequence manager is configured to, if the first plane indicated by the first address is the same as the second plane indicated by the second address, determine the second transmission sequence such that the plurality of logical page data included in the first page data set is transmitted prior to the plurality of logical page data included in the second page data set.

15. The memory controller of claim 14, wherein each of the first and second page data sets comprises LSB (least significant bit) data and MSB (most significant bit) data as the plurality of logical page data, and
wherein the data sequence manager is configured to determine, with respect to the each of the first and second page data sets, the second transmission sequence such that logical page data corresponding to a lower level is transmitted prior to logical page data corresponding to a higher level between the LSB data and the MSB data.

16. The memory controller of claim 12, wherein each of the first and second page data sets comprises LSB (least significant bit) data and MSB (most significant bit) data as the plurality of logical page data, and
wherein the data sequence manager is configured to, if the first plane indicated by the first address is different from the second plane indicated by the second address, determine, with respect to the each of the first and second page data sets, the first transmission sequence such that logical page data corresponding to a lower level is transmitted prior to logical page data corresponding to a higher level between the LSB data and the MSB data.

17. An operating method of a controller for controlling a memory device comprising a plurality of planes each comprising a plurality of memory blocks, and a plurality of multi-level buffers corresponding to the plurality of planes, the method comprising:

in response to a first page data set and a second page data set being received, allocate a first address corresponding to a first memory block among the plurality of memory blocks to the first page data set and a second address corresponding to a second memory block among the plurality of memory blocks to the second page data set;

if a plane indicated by the first address is different from a plane indicated by the second address, transmit the first page data set to a first multi-level buffer corresponding to the plane indicated by the first address among the plurality of multi-level buffers, and transmit the second page data set to a second multi-level buffer corresponding to the plane indicated by the second address among the plurality of multi-level buffers; and if the plane indicated by the first address is the same as the plane indicated by the second address, sequentially transmit the first page data set and the second page data set to the first multi-level buffer corresponding to the plane indicated by the first address and the second address among the plurality of multi-level buffers.

* * * * *